United States Patent
Yamagata et al.

(10) Patent No.: US 7,550,305 B2
(45) Date of Patent: Jun. 23, 2009

(54) METHOD OF FORMING LIGHT-EMITTING ELEMENT

(75) Inventors: Kenji Yamagata, Sagamihara (JP);
Takao Yonehara, Kawasaki (JP);
Yoshinobu Sekiguchi, Machida (JP);
Kojiro Nishi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 42 days.

(21) Appl. No.: 11/874,452

(22) Filed: Oct. 18, 2007

(65) Prior Publication Data

US 2008/0102545 A1 May 1, 2008

(30) Foreign Application Priority Data

Oct. 27, 2006 (JP) ............... 2006-293306
Nov. 16, 2006 (JP) ............... 2006-310305

(51) Int. Cl.
*H01L 21/00* (2006.01)
*H01L 21/30* (2006.01)
*H01L 21/46* (2006.01)

(52) U.S. Cl. ............... 438/29; 438/28; 438/30; 438/93; 438/455; 438/617; 257/40; 257/72; 257/E21.122; 257/E21.57; 313/504

(58) Field of Classification Search .......... 257/E21.122, 257/E21.57, E21.567
See application file for complete search history.

(56) References Cited

U.S. PATENT DOCUMENTS

2006/0220544 A1* 10/2006 Okuyama et al. ........... 313/506

2007/0194303 A1* 8/2007 Harada et al. ................ 257/40

FOREIGN PATENT DOCUMENTS

| JP | 2001-036139 | 2/2001 |
|----|-------------|--------|
| JP | 2001-156400 | 6/2001 |
| JP | 2002-015965 | 1/2002 |
| JP | 2002-299589 | 10/2002 |
| JP | 2004-146537 | 5/2004 |
| JP | 2005-012034 | 1/2005 |

* cited by examiner

*Primary Examiner*—Walter L Lindsay, Jr.
*Assistant Examiner*—Mohsen Ahmadi
(74) *Attorney, Agent, or Firm*—Locke Lord Bissell & Liddell LLP

(57) ABSTRACT

An object of the present invention is to provide a method of forming a light-emitting element at a lower cost than a conventional cost with suppressing the deterioration of the substrate due to thermal distortion in comparison with a conventional method of recycling a substrate and further having an effect equal to that of the method of recycling a substrate. The method of forming a light-emitting element by growing a separation layer and a light-emitting layer in this order on a first substrate, bonding the light-emitting layer onto a second substrate, and removing the separation layer to form the light-emitting layer on the second substrate, includes growing a plurality of groups each containing the separation layer and light-emitting layer on the first substrate; patterning the light-emitting layer existing as a uppermost layer into an island shape, and then bonding the light-emitting layer onto the second substrate, and etching the separation layer adjacent to the light-emitting layer patterned into the island shape to form the light-emitting layer patterned into the island shape on the second substrate.

12 Claims, 3 Drawing Sheets

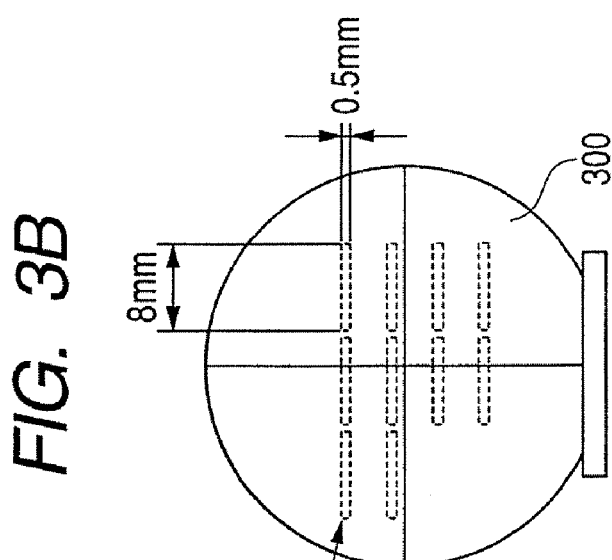
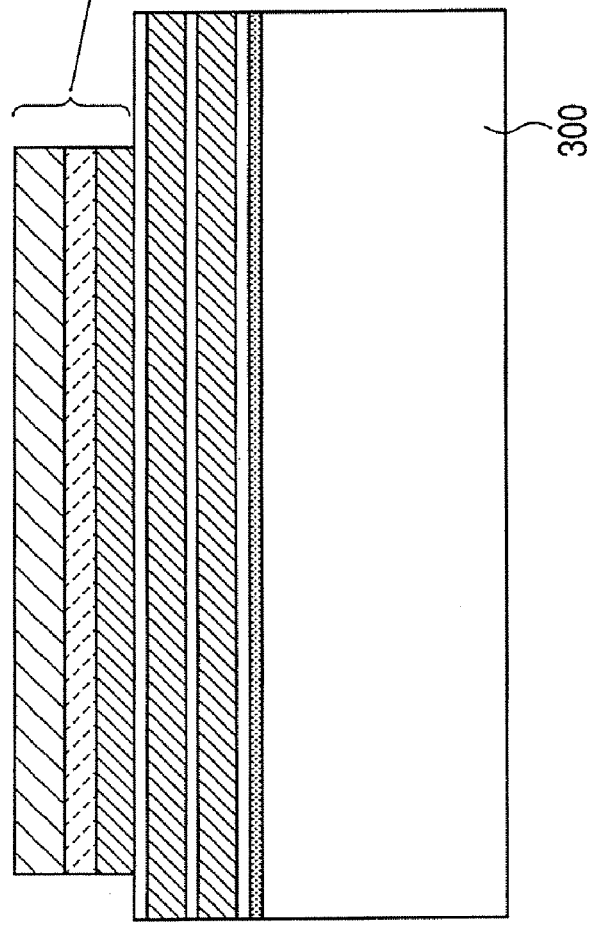
FIG. 3A
FIG. 3B

METHOD OF FORMING LIGHT-EMITTING ELEMENT

BACKGROUND OF THE INVENTION

1. Field of the Invention

The present invention relates to a method of forming a light-emitting element, specifically a method of forming a light-emitting element by separating an active layer at a separation layer to form the active layer on a substrate.

2. Description of the Related Art

Some technologies for transferring an active layer onto a supporting substrate by bonding a substrate having a separation layer and an active layer onto the supporting substrate and then separating the bonded substrate at the separation layer have been disclosed by, for example, Japanese Patent Application Laid-Open No. 2004-146537.

In the above described technologies, however, the bonded substrates are separated by etching the separation layer. Accordingly, when the substrates having a size of a substrate scale (normally, 2 inches Φ or larger) are separated from each other, it takes an extremely long period of time to separate the substrates by a method of etching the separation layer mainly from side faces of the substrates. For this reason, there is no example which has been industrially commercialized.

For this reason, some methods for the purpose of downsizing a region to be etched are proposed, which an active layer is patterned into necessary (island-shaped) regions, the regions are bonded onto a supporting substrate, and then a separation layer is etched to separate the regions from an original substrate, and which are disclosed by, for example, Japanese Patent Application Laid-Open Nos. 2002-299589, 2001-156400, 2002-15965, 2001-36139, and 2005-12034.

One of the reasons why the active layer is separated by using substrates of a substrate scale in the conventional technologies as described above is to reuse (recycle) an expensive substrate, which is an important view point.

Specifically, the technology includes recycling the substrate by repeating the steps of: separating a substrate from a separation layer to return the substrate into an original condition; subjecting the substrate to a cleaning step and the like; and then growing a separation layer and an active layer again on the substrate.

In actual fact, however, the technology has a disadvantage that when the films are repeatedly grown thereon at a high temperature, the substrate becomes very brittle because distortion is accumulated in the substrate due to heat, and has been technically difficult.

In addition, the technology has lost one half its initial effectiveness of recycling because a cost of epitaxial growth is high as well as a substrate cost.

SUMMARY OF THE INVENTION

For this reason, an object of the present invention is to provide a method of forming a light-emitting element at a lower cost than a conventional cost, while suppressing the deterioration of the substrate due to thermal distortion in comparison with a conventional method of recycling a substrate and further having an effect equal to that of the conventional method of recycling a substrate.

As the means for solving the above described problem, the present invention provides a method of forming a light-emitting element by growing a separation layer and a light-emitting layer in this order on a first substrate, bonding the light-emitting layer onto a second substrate, and removing the separation layer to form the light-emitting layer on the second substrate, including: growing a plurality of groups of the separation layers and the light-emitting layers on the first substrate, wherein the separation layer and the light-emitting layer to be grown on the first substrate constitute one group; patterning the light-emitting layer existing as a uppermost layer into an island shape, and then bonding the light-emitting layer onto the second substrate; and etching the separation layer adjacent to the light-emitting layer patterned into the island shape to form the light-emitting layer patterned into the island shape on the second substrate.

The present invention also provides a method of producing a light-emitting element by forming a separation layer and a light-emitting layer on the first substrate in this order from the side of the first substrate, bonding the first substrate onto the second substrate so that the light-emitting layer is positioned in the inner side to form a bonded member, and etching and removing the separation layer to transfer the light-emitting layer onto the second substrate: and includes the following steps (1) to (3): (1) the step of repeating formation of a group of the separation layer and the light-emitting layer on the first substrate by n times, wherein the group is a pair of the separation layer and the light-emitting layer, and wherein n is a natural number of 2 or more; (2) the step of patterning only the light-emitting layer existing as a uppermost surface into a plurality of island shapes, and then bonding the first substrate onto the second substrate to form a bonded structure; and (3) the step of infiltrating an etching solution into a space which is formed in the bonded structure by patterning of the island shapes, bringing the etching solution into contact with the separation layer, and selectively transferring the light-emitting layer having the island shapes onto the second substrate.

The method of forming a light-emitting element according to the present invention provides an effect of recycling a substrate while keeping a lower cost and a lower stress of the substrate (leading to higher crystalline quality) than a normal method of transferring a film and recycling a substrate.

Further features of the present invention will become apparent from the following description of exemplary embodiments with reference to the attached drawings.

BRIEF DESCRIPTION OF THE DRAWINGS

FIGS. 3A and 3B are a plan view and a sectional view illustrating the second example of the present invention.

DESCRIPTION OF THE EMBODIMENTS

Figure 1A:
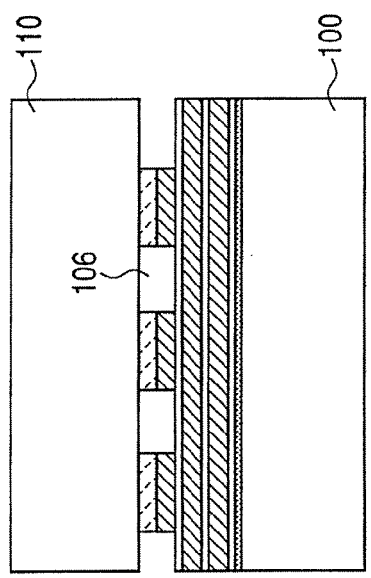
FIGS. 1A, 1B, 1C, 1D and 1E are sectional views illustrating the steps of a method of forming a light-emitting element according to one embodiment of the present invention.

An exemplary embodiment according to the present invention will be described below with reference to the attached drawings.

FIGS. 1A to 1E are sectional views illustrating the steps of the method of forming a light-emitting element according to one embodiment of the present invention. In the figures, reference numeral 100 denotes the first substrate, reference numeral 101 denotes a buffer layer, reference numeral 102 denotes a separation layer, reference numeral 103 denotes an active layer (light-emitting layer), reference numeral 104 denotes a light reflection layer, reference numeral 105 denotes a resist film, reference numeral 106 denotes an etched groove, and reference numeral 110 denotes the second substrate.

In FIG. 1A, at first, the first substrate 100 on which layers are formed will be described.

In the present embodiment, AlAs (AlGaAs) is used for a separation layer because of having properties of being highly selectively etched, so that a substrate needs to be capable of epitaxially growing the separation layer and the like thereon. An example thereof includes a GaAs substrate and a Ge substrate which have approximately the same crystal lattice constant as that of the separation layer. Si has a lattice constant different from GaAs by about 4%, but can directly grow a GaAs film thereon. Accordingly, the first substrate 100 can be a Si substrate having a GaAs film grown thereon. These substrates may also be doped with an impurity.

In FIG. 1A, members except the first substrate 100 will be now described.

A separation layer 102 and an active layer 103 are epitaxially grown on the first substrate 100 sequentially in this order.

The material of the separation layer 102 is made from AlAs or $Al(x)Ga(1-x)As$ ($x \geq 0.7$), and can have a film thickness of several tens to several hundreds nanometers.

The active layer 103 functions as a light-emitting layer in a light-emitting element, and is made of a compound semiconductor such as GaAs, AlGaAs, InGaAs, GaP, InGaP and AlInGaP. The active layer 103 also has a p-n junction therein.

A buffer layer 101 is optionally formed prior to the step of forming the separation layer 102. The buffer layer 101 is formed for the purpose of reducing crystal defects.

The layers can be grown by any growing method without being limited to a particular method, as long as the method can uniformly grow the layers, and the growing method includes an MOCVD method, an MBE method and an LPE method.

Furthermore, a plurality of groups of the separation layers 102 and the active layers 103 are sequentially grown to form n groups of the layers, wherein one separation layer 102 and one active layer 103 constitute one group. In this case, each separation layer 102 does not necessarily need to have the same thickness. The separation layers can also be thinner as the layers become an upper layer.

This method is one technique for minimizing useless etching in a lower layer part of an outer circumferential portion of the first substrate 100, in consideration of a fact that a thinner separation layer 102 has a larger etching rate when the separation layer 102 is etched from its side surface.

Figure 1D:
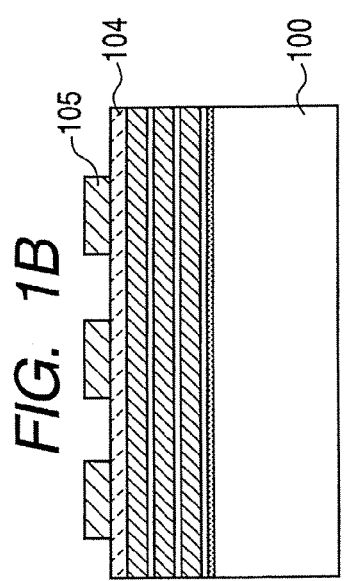
Figure 1B:
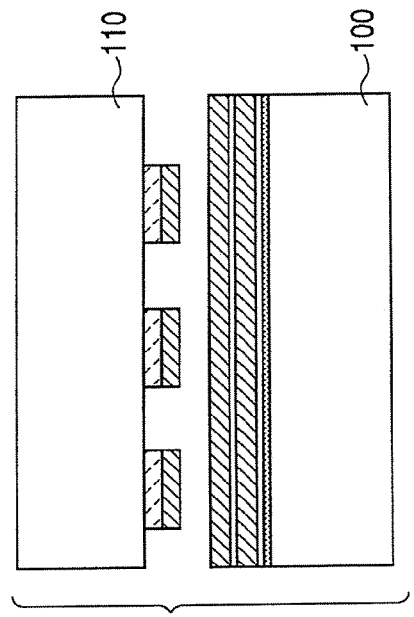

Subsequently, a light reflection layer 104 is formed on an active layer 103 as the uppermost part, as shown in FIG. 1B.

Then, a resist pattern 105 is formed on the light reflection layer 104 so as to leave the light reflection layer 104 in an island shape.

The material of the light reflection layer 104 can be a material having a high reflectance against a wavelength of a light emitted from a light-emitting element to be formed. When the light-emitting element is made of a GaAs-based material and emits a light with a wavelength of about 750 to 800 nm, the light reflection layer 104 can be made of Au (gold), Ag (silver) or Al (aluminum), for instance. Of course, the light reflection layer 104 may be also made of another optical reflection material.

When the light-emitting element emits a blue light with a wavelength of about 360 nm, the light reflection layer 104 can be made of Al or the like.

An active layer 103 formed into an island shape may be configured so that one island-shaped active layer 103 composes a light-emitting layer of one light-emitting element, or so that one island-shaped active layer 103 forms a region including a plurality of light-emitting elements in an arrayed shape. In this case, a size of the island-shaped active layer 103 is equal to the size of a chip produced when the second substrate 110 described below will be diced.

A light reflection layer 104 is not indispensably needed but may be formed on the side of a second substrate 110 as will be described later, or even may not exist.

Figure 1E:
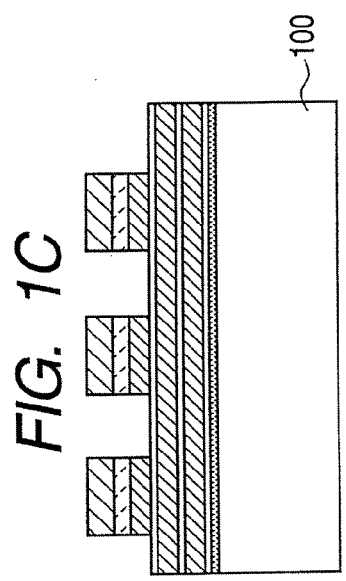
Figure 1C:
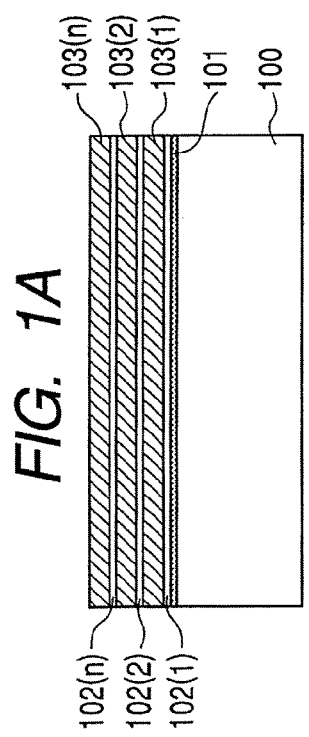

Subsequently, a light reflection layer 104 and an active layer 103 existing at the uppermost part are etched into an island shape to expose a part of a separation layer 102 existing at the uppermost part, as shown in FIG. 1C.

Then, the second substrate 110 is bonded to the first substrate 100, as shown in FIG. 1D.

The second substrate 110 may be made of any material. The material may be a semiconductor substrate such as a Si substrate, an electroconductive substrate and an insulating substrate.

A light reflection layer 104 may be also formed on the surface of the second substrate 110 beforehand. Alternatively, the light reflection layer 104 may be formed on the surfaces of both of the first substrate 100 and the second substrate 110 and the light reflection layers 104 may be bonded onto each other.

As for the method of bonding the second substrate 110 onto the first substrate 100, there are used a method of bonding substrates and subsequently heating them, a method of bonding substrates and subsequently pressurizing them, and combination of both methods. It is also effective to bond the substrates onto each other under an atmosphere of a reduce pressure.

After the substrates have been bonded to each other, a space 106 corresponding to a patterned groove is formed in the vicinity of an interface thereof.

FIG. 1E is a view illustrating a separated state of each substrate.

The substrates are separated by etching a separation layer 102 as the uppermost layer.

In this case, an etching solution flows into the space 106 formed by the separated regions of the island shape.

Then, the etching solution etches the separation layer 102 as the uppermost layer, and consequently separates the second substrate 110 from the first substrate 100. As a usable etching solution, a hydrofluoric acid solution or a hydrochloric acid solution can be used.

As a result, an active layer 103 having an island-shaped region is transferred onto the second substrate 110.

The second substrate 110 having the transferred active layer 103 thereon is moved to a device process, and a light-emitting element is formed.

On the other hand, the first substrate 100 loses the active layer 103 of the uppermost layer and the separation layer 102 as the transferring and etching step to show another active layer 103 as the uppermost surface, and is returned to a step illustrated in FIG. 1A.

When a pair of an active layer 103 and a separation layer 102 is defined as one group, and the substrate has n groups formed thereon, n sheets of light-emitting elements can be formed by a process of repeating n times of the above steps.

FIRST EXAMPLE

A first example according to the present invention will be now described with reference to FIGS. 2A to 2D. In the figures, reference numeral 200 denotes the first substrate, reference numeral 201 denotes a buffer layer, reference numeral 202 denotes a separation layer, reference numeral 203 denotes an active layer (light-emitting layer), reference numeral 204 denotes a light reflection layer, reference numeral 205 denotes a resist film, reference numeral 206 denotes an etched groove, and reference numeral 210 denotes the second substrate.

Figure 2A:
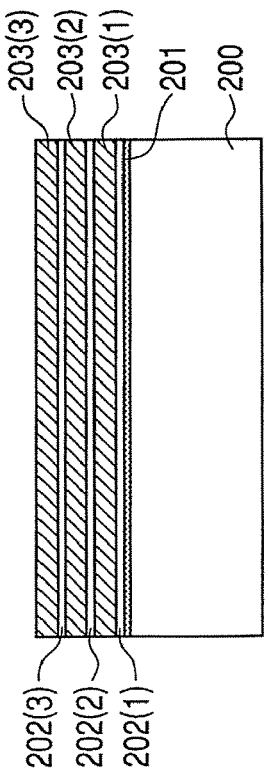
FIGS. 2A, 2B, 2C and 2D are sectional views illustrating the steps of the first example of the present invention.

At first, a GaAs buffer layer 201 with a thickness of 20 nm, a p-AlAs layer 202(1) with a thickness of 100 nm, and an active layer 203(1) with a thickness of about 2,000 nm are grown on a 4-inch GaAs substrate 200 by an MOCVD method, as is illustrated in FIG. 2A.

The active layer 203(1) will be now described in detail below.

Specifically, the active layer 203(1) includes a p-GaAs layer to be a contact layer with the thickness of 20 nm, a p-$Al_{0.4}$GaAs layer to be a p-side clad layer with the thickness of 350 nm, a p-$Al_{0.13}$GaAs layer to be a light-emitting layer with the thickness of 300 nm, and an n-$Al_{0.23}$GaAs to be an n-side clad layer with the thickness of 130 nm.

Figure 2B:
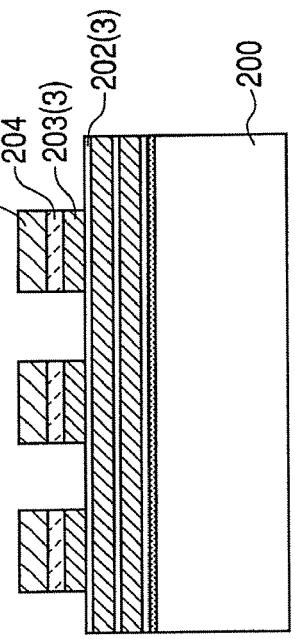

Subsequently, a separation layer 202(2), an active layer 203(2), a separation layer 202(3) and an active layer 203(3), which have the same layer structure as that of the separation layer 202 and the active layer 203, are sequentially grown, as is illustrated in FIG. 2B.

Figure 2C:
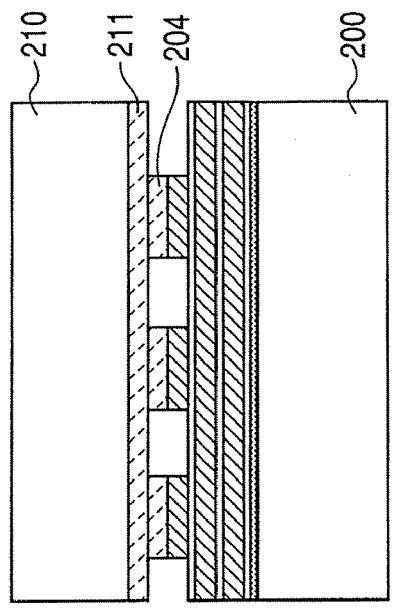

Then, an Au (gold) layer is formed in the thickness of 70 nm on the active layer 203 (3) as the uppermost surface by a sputtering method, as is illustrated in FIG. 2C.

Island-shaped regions with the size of 20 μm×20 μm are formed thereon at spacings of 42 μm by using a photolithography technique.

The Au layer is etched by a mixture liquid of $I_2$ (iodine) and KI (potassium iodide) under a wet condition. After the resist has been removed, an active layer 203(3) is etched while using the Au layer as a mask.

The active layer 203(3) is etched by a solution containing $NH_4OH:H_2O_2$=1:50, at 30° C. The active layer 203(3) is etched for about 3 minutes, and a separation layer 202(3) is exposed.

A silicon substrate 210 with the size of 4 inches is prepared as the second substrate, and an Au film is formed in the thickness of 70 nm on its surface by a sputtering method, as is illustrated in FIG. 2C.

Then, the Au surfaces of the first patterned substrate 200 and the second substrate 210 are bonded onto each other.

The Au surfaces are bonded onto each other in a reduced-pressure atmosphere of $1×10^{-2}$ Pa, at 200° C. and under a pressing pressure of 500 N/4-inch φ.

Figure 2D:
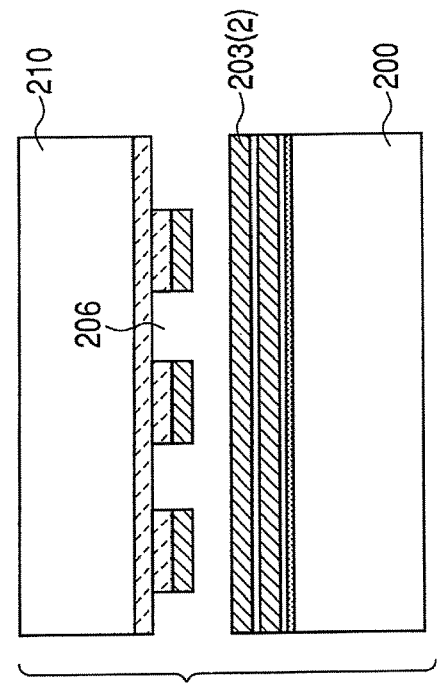

The bonded substrates are immersed in a 10% hydrofluoric acid solution, as is illustrated in FIG. 2D.

The hydrofluoric acid solution enters into a space 206 in bonded surfaces to etch a separation layer 202 (3). As a result, a GaAs substrate (first substrate) 200 is separated from a silicon substrate (second substrate) 210.

Light-emitting element regions arranged in an arrayed shape at spacings of 42 μm on the surface of the silicon substrate 210 are obtained. The substrate is charged into a normal LED process, and light-emitting arrayed elements of 600 dpi are formed. On the other hand, on the GaAs substrate, an active layer 203(2) which is a flat uppermost surface appears.

By repeating the above described steps further twice, three substrates of the light-emitting element in total can be obtained.

SECOND EXAMPLE

A second example according to the present invention will be now described with reference to FIGS. 3A and 3B.

The same substrate as in the first example is prepared, an Au film is formed thereon, and the pattern is formed in the same manner as in the first example. However, an island-shaped region to be patterned is a rectangular shape having an area of 8 mm×0.5 mm.

Afterwards, the light-emitting element region of 8 mm×0.5 mm is transferred onto a silicon substrate in the same process to that in the first example.

The silicon substrate is charged into an LED process, and is produced into elements with the size of 20×20 μm arrayed at spacings of 600 dpi in the process.

THIRD EXAMPLE

In the present example, the same steps as in the first example are carried out, but the following items are changed.

A Ge (germanium) substrate with the size of 8 inches is used as the first substrate. A silicon substrate with the size of 8 inches is used as the second substrate. A light reflection layer is not formed on a silicon substrate.

The present invention can be used in a method of forming a light-emitting element, and a method of forming a light-emitting element particularly by separating an active layer at a separation layer to form an active layer on a substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2006-293306, filed on Oct. 27, 2006 and No. 2006-310305, filed on Nov. 16, 2006 which are hereby incorporated by reference herein in their entirety.

What is claimed is:

1. A method of forming a light-emitting element by growing a separation layer and a light-emitting layer in this order on a first substrate, bonding the light-emitting layer onto a second substrate, and removing the separation layer to form the light-emitting layer on the second substrate, comprising:

growing a plurality of groups of the separation layers and the light-emitting layers on the first substrate, wherein the separation layer and the light-emitting layer to be grown on the first substrate constitute one group;

patterning the light-emitting layer existing as a uppermost layer into an island shape, and then bonding the light-emitting layer to the second substrate; and etching the separation layer adjacent to the light-emitting layer patterned into the island shape to form the light-emitting layer patterned into the island shape on the second substrate.

2. The method of forming a light-emitting element according to claim 1, wherein a plurality of the second substrates are provided, and the light-emitting layer is formed on the plurality of the second substrates.

3. The method of forming a light-emitting element according to claim 1, wherein a light reflection layer is formed on the light-emitting layer as the uppermost layer.

4. The method of forming a light-emitting element according to claim 1, wherein a light reflection layer is formed on the second substrate, and the light-emitting layer as the uppermost layer is formed on the light reflection layer.

5. The method of forming a light-emitting element according to claim 1, wherein the first substrate is made of a compound semiconductor.

6. The method of forming a light-emitting element according to claim 1, wherein the second substrate is made of silicon.

7. The method of forming a light-emitting element according to claim 1, wherein the separation layer is etched by using an etching solution.

8. The method of forming a light-emitting element according to claim 7, wherein the etching solution is a hydrofluoric acid or hydrochloric acid solution.

9. The method of forming a light-emitting element according to claim 1, wherein film thicknesses of the separation layer and light-emitting layer in the plurality of the groups of decreases as the layers become an upper layer.

10. The method of forming a light-emitting element according to claim 1, wherein a region of the light-emitting layer having the island shape is formed so that the region of the light-emitting layer having one island shape constitutes a light-emitting layer of one light-emitting element.

11. The method of forming a light-emitting element according to claim 1, wherein a region of the light-emitting layer having the island shape is formed so as to include the light-emitting layers of a plurality of light-emitting elements in an arrayed shape and have a size equal to a size of a chip produced when the second substrate is diced.

12. A method of producing a light-emitting element by forming a separation layer and a light-emitting layer on a first substrate in this order from a side of the first substrate, bonding the first substrate to a second substrate so that the light-emitting layer is positioned in an inner side to form a bonded member, and etching and removing the separation layer to transfer the light-emitting layer onto the second substrate, comprising:

repeating formation of a group of the separation layer and the light-emitting layer on the first substrate by n times, wherein the group is a pair of the separation layer and the light-emitting layer, and wherein n is a natural number of 2 or more;

patterning only the light-emitting layer existing as a uppermost surface into a plurality of island shapes, and then bonding the first substrate onto the second substrate to form a bonded structure; and infiltrating an etching solution into a space which is formed in the bonded structure by patterning of the island shapes, bringing the etching solution into contact with the separation layer, and selectively transferring the light-emitting layer having the island shapes onto the second substrate.

* * * * *